US012038588B2

(12) United States Patent
Zhou

(10) Patent No.: US 12,038,588 B2
(45) Date of Patent: *Jul. 16, 2024

(54) MICRO LED LAYOUT FOR AUGMENTED REALITY AND MIXED REALITY AND METHOD OF MANUFACTURING THE SAME

(71) Applicant: UNITED MICROELECTRONICS CORP., Hsin-Chu (TW)

(72) Inventor: Zhibiao Zhou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,381

(22) Filed: Aug. 21, 2023

(65) Prior Publication Data

US 2023/0400692 A1   Dec. 14, 2023

Related U.S. Application Data

(60) Continuation of application No. 18/082,553, filed on Dec. 15, 2022, now Pat. No. 11,774,766, which is a division of application No. 17/355,196, filed on Jun. 23, 2021, now Pat. No. 11,561,403.

(30) Foreign Application Priority Data

May 21, 2021   (CN) .......................... 202110558169.9

(51) Int. Cl.
*G02B 27/01* (2006.01)
*H01L 25/075* (2006.01)
*H01L 33/62* (2010.01)

(52) U.S. Cl.
CPC ...... *G02B 27/0172* (2013.01); *H01L 25/0753* (2013.01); *H01L 33/62* (2013.01); *G02B 2027/0178* (2013.01)

(58) Field of Classification Search
CPC ........ G02B 27/0172; G02B 2027/0178; H01L 25/0753; H01L 33/62
See application file for complete search history.

(56) References Cited

U.S. PATENT DOCUMENTS

| 8,765,333 | B2 | 7/2014 | Yu |
| 8,779,539 | B2 | 7/2014 | Kao |
| 8,815,102 | B2 | 8/2014 | Wu |
| 8,828,779 | B2 | 9/2014 | Zhao |
| 9,401,441 | B2 | 7/2016 | Wen |

(Continued)

*Primary Examiner* — Stephen G Sherman
(74) *Attorney, Agent, or Firm* — Winston Hsu

(57) ABSTRACT

A method of manufacturing a layout structure of Micro LED for augmented reality and mixed reality is provided in the present invention, including steps of providing a substrate with multiple display units arranged thereon to form an unit array and includes an edge region and a transparent region surrounded by the edge region, forming pixel driver circuits and a first transparent layer on the edge region, setting multiple Micro LEDs on the first transparent layer of edge regions, forming a second transparent layer on the Micro LEDs and the first transparent layer, thinning and removing the substrate on the transparent region to expose the first transparent layer, and forming a protection layer on back sides of the substrate and the exposed first transparent layer.

5 Claims, 6 Drawing Sheets

(56) References Cited

U.S. PATENT DOCUMENTS

| | | |
|---|---|---|
| 9,674,436 B2 | 6/2017 | Crane |
| 9,813,095 B2 | 11/2017 | Li |
| 10,303,250 B2 | 5/2019 | Jeong |
| 10,739,850 B2 | 8/2020 | Stafford |
| 11,774,766 B2 * | 10/2023 | Zhou ..................... H01L 33/62 |
| | | 345/8 |
| 2014/0027709 A1 | 1/2014 | Higginson |
| 2018/0166429 A1 | 6/2018 | Chong |
| 2019/0388782 A1 | 12/2019 | Lee |
| 2020/0004028 A1 | 1/2020 | Lee |
| 2021/0157167 A1 | 5/2021 | Lim |

* cited by examiner

MICRO LED LAYOUT FOR AUGMENTED REALITY AND MIXED REALITY AND METHOD OF MANUFACTURING THE SAME

CROSS REFERENCE TO RELATED APPLICATIONS

This application is a continuation application of U.S. application Ser. No. 18/082,553, filed on Dec. 15, 2022, which is a division of U.S. application Ser. No. 17/355,196, filed on Jun. 23, 2021. The contents of these applications are incorporated herein by reference.

BACKGROUND OF THE INVENTION

1. Field of the Invention

The present invention generally relatives to a layout structure for Micro LED, and more specifically, to a Micro LED layout structure for augmented reality (AR) and mixed reality (MR) and method of manufacturing the same.

2. Description of the Prior Art

Micro LED is an emerging display technology in recent years, featuring miniaturized LED array and self-luminous display characteristic. Each pixel of Micro LED may be driven individually and has high brightness, high contrast, low power consumption and vivid color saturation. Compared to similar self-luminous OLED, Micro LED has the advantage of higher efficiency, extended lifespan and better environmental tolerance. The unique characteristics of low power consumption and high brightness make it suitable in the application of wearable watches, cell phones, automobile displayers, augmented reality (AR) and mixed reality (MR) displayers and televisions. For these reasons, Micro LED is considered as the most promising display technology in succession to transitional Mini LED in next generation.

In view of aforementioned low power consumption and high contrast characteristics of Micro LED, the industry professionals are focused and dedicated to develop novel Micro LED structures and relevant processes in order to apply them in small size wearable AR/MR devices, ex. smart glasses with AR/MR functions. Nevertheless, there are still many technical obstacles to overcome in the application of Micro LED to the AR/MR wearable devices, such as the challenge of mass transfer, how to improve the transparency, how to manufacture of Micro LED lens, and the compatibility to existing complementary metal oxide semiconductor (CMOS) processes.

SUMMARY OF THE INVENTION

In dedication to develop the application of Micro LED in augmented reality (AR) and mixed reality (MR), there present invention hereby provides a novel layout structure of Micro LED, featuring the design of arranging Micro LEDs on edges of every display unit to expose the middle transparent region, thereby achieving better display quality with high transmittance along with high contrast and high luminous efficacy.

One aspect of the present invention is to provide a layout structure of Micro LED for augmented reality and mixed reality, including a transparent substrate with multiple display units arranged thereon to form an unit array, multiple Micro LEDs set on an edge region of each display unit and exposing a transparent region surrounded by the edge region, and pixel driver circuits set right under Micro LEDs on the edge regions.

Another aspect of the present invention is to provide a method of manufacturing a layout structure of Micro LED for augmented reality and mixed reality, including steps of providing a substrate, wherein multiple display units are arranged on the substrate to form an unit array, and each display unit including an edge region and a transparent region surrounded by said edge region. Forming pixel driver circuits and a first transparent layer on the edge region of every display unit on the substrate, and setting multiple Micro LEDs on the first transparent layer of the edge regions, wherein the Micro LEDs connect with the pixel driver circuits below.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
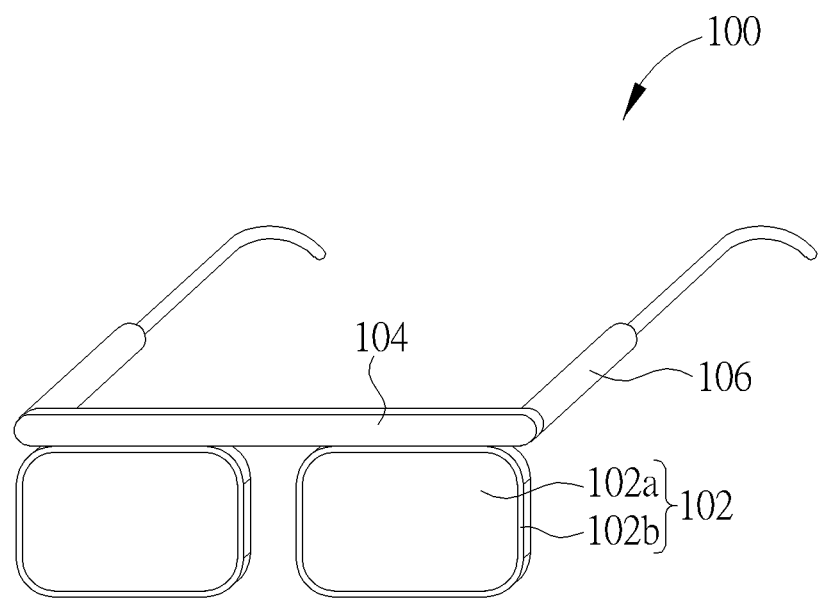
FIG. 1 is a schematic view of a pair of smart glasses carrying the lens with Micro LED layout structure of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

Please refer to FIG. 1, which is a schematic view of a pair of smart glasses 100 carrying the lens with the Micro LED layout structure of the present invention. The smart glass 100 is composed of three parts, i.e. lens 102, frame 104 and temples 106. Each lens 102 is defined with a peripheral region 102b at lens edges and a middle region 102a surrounded by the peripheral region 102b, wherein the middle region 102a is a transparent part of common lens. The wearer may receive the image light from outside through this part. In the embodiment of present invention, display unit array formed by arranged Micro LEDs will be set on the middle region 102a of lens 102 to provide images and information required in the operation of augmented reality and mixed reality. The peripheral region 102b of lens 102 may be an opaque non-viewable part for LED driver circuits and main logic circuits to be set thereon in order to operating Micro LEDs. The design of setting LED driver circuits and logic circuits at the peripheral of lens 102 may prevent those circuit components blocking the viewable middle region 102a, thereby improving overall transmittance and visual experience of the lens.

Refer still to FIG. 1. The frame 104 of smart glass 100 is adjoined with the lens 102. Small circuit board, for example the circuit board with wireless communication modules, sensor modules and microphone components, may be set in the frame 104. Main circuit board, for example the circuit board with microprocessor, microsystem module and speaker components, may be set in the temple 106 with larger space. Large power battery components may also be accommodated in the temple 106. The aforementioned functional circuits and modules may be connected with the circuits on the peripheral region 102b of lens 12 through wirings in the frame 104, so that the conveyed images and information may be displayed through the unit array formed by arranged Micro LEDs on the lens 102. In addition, the design of setting the aforementioned functional circuits and modules in the frame 104 or temple 106 with sufficient weight bearing may provide better wearing experience.

Figure 2:
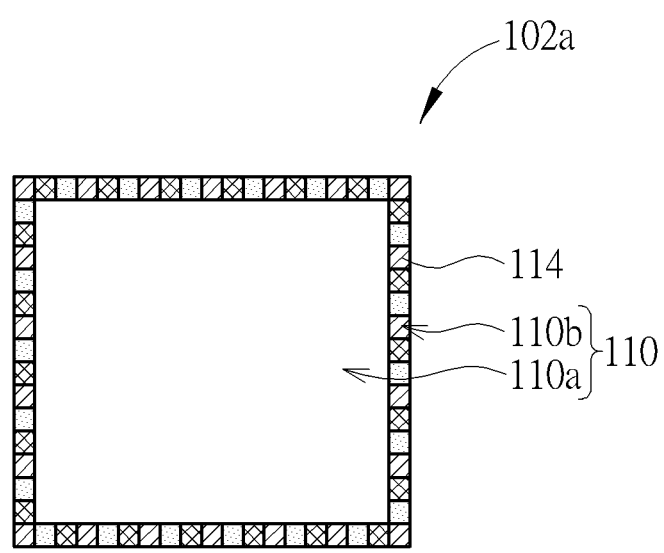
FIG. 2 is a schematic view of a display unit with Micro LEDs in accordance with the preferred embodiment of present invention.

Next, please refer to FIG. 2, which is a schematic view of a display unit with Micro LEDs according to the preferred embodiment of present invention. In the embodiment of present invention, AR/MR interactive images or information are displayed on the lens through image light emitted from multiple display units 110. Every display unit 110 is preferably in the same and regular shape, as the square shown in FIG. 2. In other embodiment, the display unit 100 may also be rectangle or polygon as long as they can be arranged into uniform and regular unit array on the middle region 102a of lens 102. In the embodiment of present invention, each display unit 110 is provided with an edge region 110b at edges and a transparent region 110a surrounded by the edge region 110b, wherein the transparent region 110a of display unit 110 is considered as the main body of lens 102 and will not be set with any components, while the edge region 110b of display unit 110 is set with multiple Micro LEDs 114, which preferably surround the entire transparent region 110a of display unit 110. In the preferred embodiment of present invention, Micro LEDs 114 include red, green and blue LEDs. Every Micro LED 114 functions as a sub-pixel, and every set of red, green and blue LEDs constitutes a pixel, i.e. image dot capable of emitting full-color light. Image light emitted by those pixels may be combined into an output image to be presented on the lens.

Figure 3:
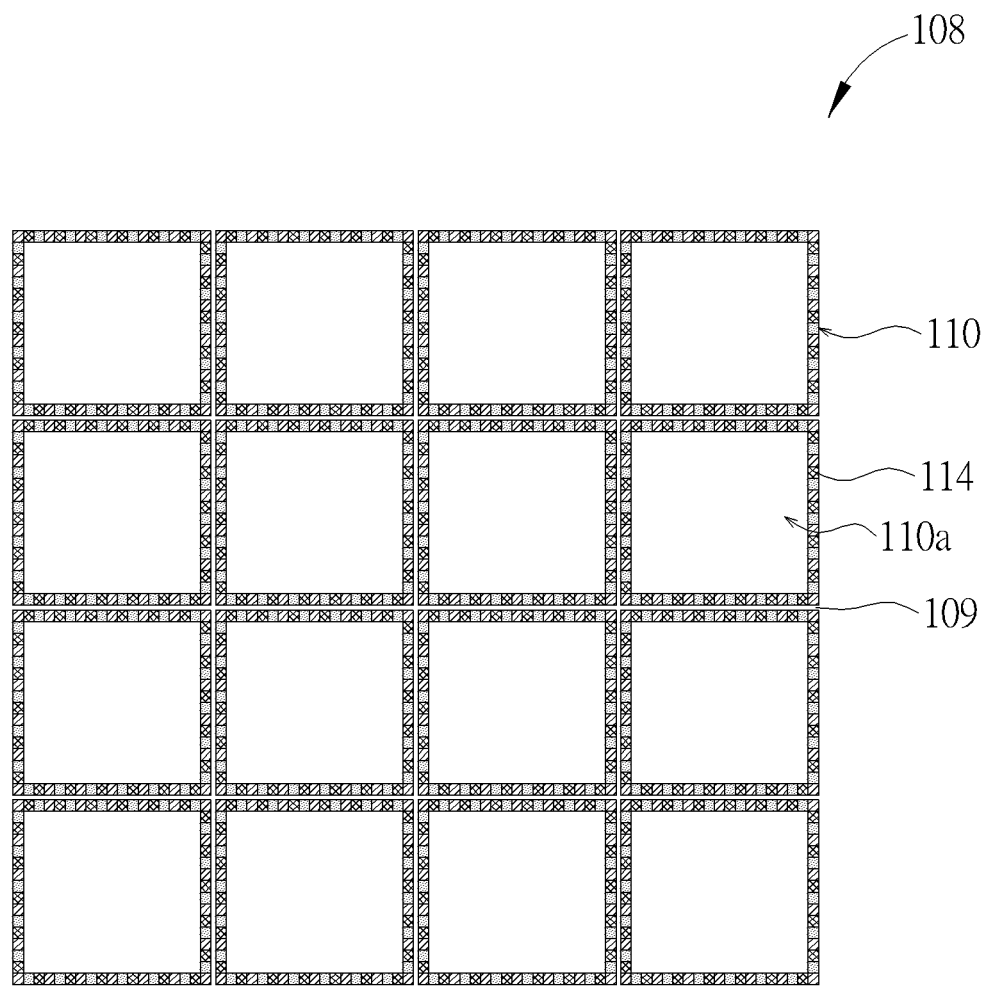
FIG. 3 is a schematic view of an unit array with Micro LEDs in accordance with the preferred embodiment of present invention.

Next, please refer to FIG. 3, which is a schematic view of an unit array with Micro LEDs in accordance with the preferred embodiment of present invention. In the embodiment of present invention, the aforementioned multiple display units 110 are arranged into an unit array 108 on the middle region 102a of lens 102. As shown in FIG. 3, the unit arrays 108 are spaced apart by a small spacing 109 in a close arrangement. In such arrangement, it can be seen that Micro LEDs 114 are arranged in a mesh form on lens surface. That is, the Micro LEDs 114 constitute a displayer on the lens surface for outputting AR/MR interactive images or information. On the other hand, the parts not covered and set with Micro LEDs 114 (i.e. the transparent regions 110a) functions as a transparent part in common lens. The wearer may receive the image light from outside through those transparent parts.

In view of the aforementioned features of present invention, the present invention is advantageous in following points in comparison to prior arts: firstly, the Micro LEDs 114 of present invention is manufactured directly on the transparent/viewable region of lens. This approach is quite different from the prior art that adopting waveguide interference, which the image is directed onto the lens surface from image output devices outside of the lens. The approach of outputting image directly from the lens surface may provide higher contrast, distortion-free, wider viewing angle, and less power consumption. Furthermore, the design of aforementioned display units 110 in the present invention may create uniform and large transparent regions on lens surface to make the inherent transmittancy of lens less affected by the Micro LEDs. The transmittance in this design may be larger than 50%, even 70%, without compromising excellent image output quality.

Figure 4:
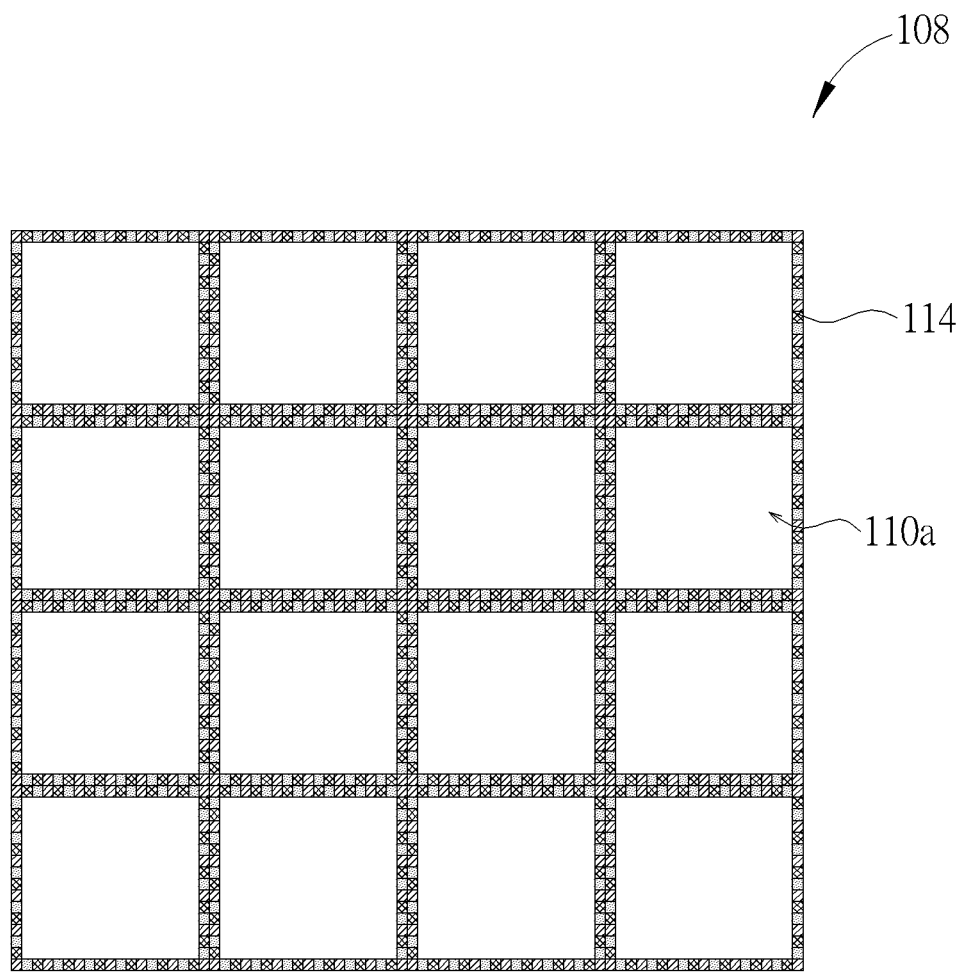
FIG. 4 is a schematic view of an unit array with Micro LEDs in accordance with another embodiment of present invention.

Next, please refer to FIG. 4, which is a schematic view of an unit array with Micro LEDs in accordance with the preferred embodiment of present invention. The unit array 108 in this embodiment is similar to the aforementioned embodiment, wherein the difference lies in the display units 110 in this embodiment been adjoined each other without any spacing.

Figure 5:
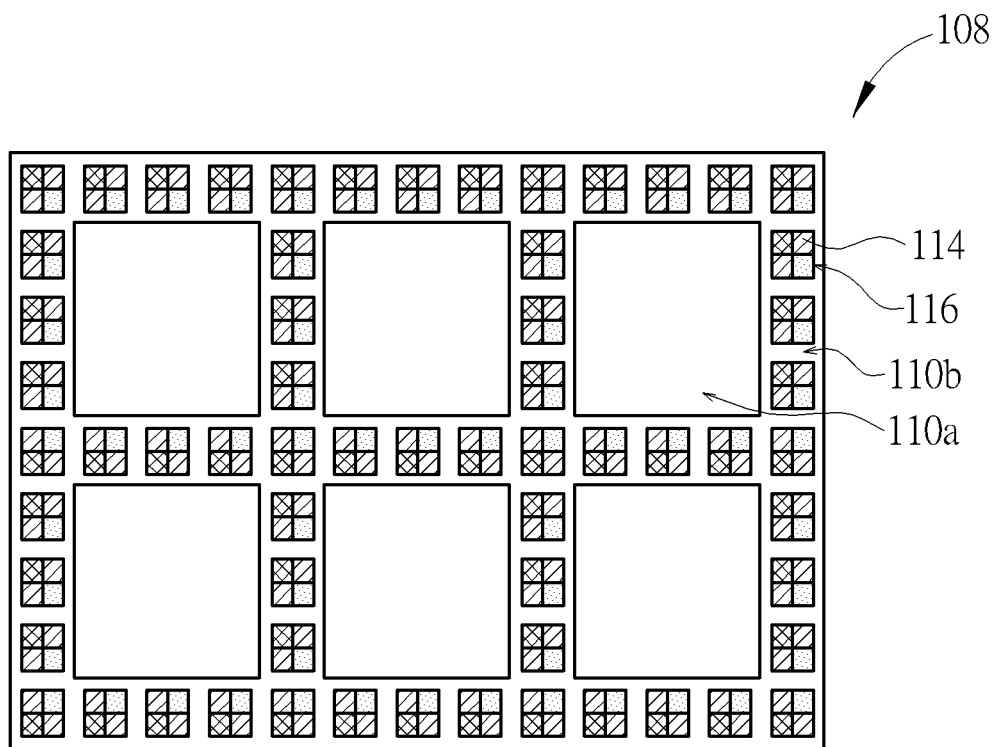
FIG. 5 is a schematic view of an unit array with Micro LEDs in accordance with still another embodiment of present invention.

Next, please refer to FIG. 5, which is a schematic view of an unit array with Micro LEDs in accordance with still another embodiment of present invention. In this embodiment, the composition of display unit 110 is similar to the aforementioned embodiment. However, Micro LEDs 114 are not arranged to surround the entire transparent region 110a. Instead, every four of the Micro LEDs 114 (for example, a set of red, green, red and blue LEDs) are arranged first to form a square mini array, and theses mini arrays are spaced apart and set on the edge region 116 of each display unit 110. The design of mini array 116 of Micro LEDs 114 may improve the yield of mass transfer and decrease required processing time, since the Micro LEDs 114 may be picked and placed by sets in this way in the mass transfer step.

Next, please refer sequentially to FIG. 6 to FIG. 10, which are schematic views of a process flow of manufacturing the Micro LED layout structure in accordance with the preferred embodiment of present invention. The process of Micro LED layout structure in the present invention may be integrated with current CMOS process. More specifically, the Micro LED layout structure of present invention may be formed together with necessary peripheral drive circuits and logic circuits on the lens in the same CMOS process. There is no need to develop new or additional processes and it may not affect existing process, to save a great amount of manufacturing cost and development time.

Figure 6:
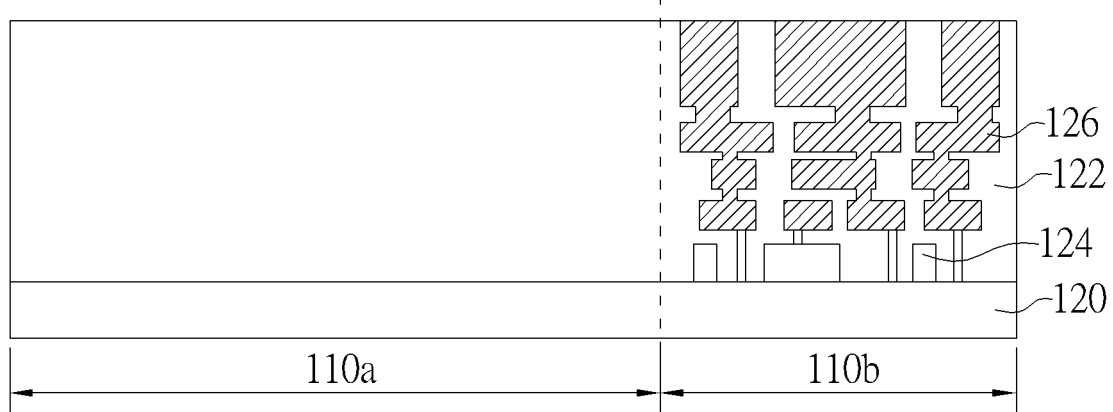
FIGS. 6-10 are schematic views of a process flow of manufacturing the Micro LED layout structure in accordance with the preferred embodiment of present invention.

Firstly, please refer to FIG. 6. Provide a substrate 120, such as a substrate made of semiconductor materials and suitable for CMOS process, to serve as a base for entire process, wherein the semiconductor materials may be selected from silicon (Si), germanium (Ge), silicon-germanium alloy (SiGe), silicon carbide compound (SiC), silicon arsenide compound (SiAs) or the combination thereof. In the embodiment of present invention, the aforementioned transparent regions 110a and edge regions 110b of display unit 110 are defined on the substrate 120, wherein the transparent region 110a will not be set with any components, while the edge region 110b will be set with the Micro LEDs of present invention and components like driver circuits. Next, components like pixel driver circuits 124 and metal interconnects 126 are manufactured on the edge region 100b of substrate 120 through ordinary CMOS process. Please note that in the embodiment of present invention, the pixel driver circuits 124 (including gate devices) may be formed along with the components like LED driver circuits and logic circuits set on the peripheral region 102b (see FIG. 1) of the lens in the front-end-of-line (FEOL) of CMOS process, and pixel driver circuits 124 will be electrically connected with theses LED driver circuits and logic circuits in order to receive or transmit required image signals. In the same way, metal interconnects 126 on the edge region 100b may be formed along with the metal interconnects on the peripheral region 102b of the lens in back-end-of-line (FEOL) of CMOS process. The pixel driver circuits 124 may be made by adopting common cathode design and may be connected to metal interconnects 126 through contacts. The aforementioned pixel driver circuits 124 and metal interconnects 126 may both be formed in a first transparent layer 122 on the substrate 120. The first transparent layer 122 may include inter-layer dielectrics (ILD) and inter-metal dielectrics (IMD) in common logic devices, whose material may be ultra low-k material or tetraethoxysilane (TEOS), to be formed on the substrate through chemical vapor deposition (CVD) process. The material of metal interconnects 126 may be selected from but not limited to tungsten (W), copper (Cu), aluminum (Al), titanium aluminide (TiAl), cobalt tungsten phosphide (CoWP) or the combination thereof.

Figure 7:
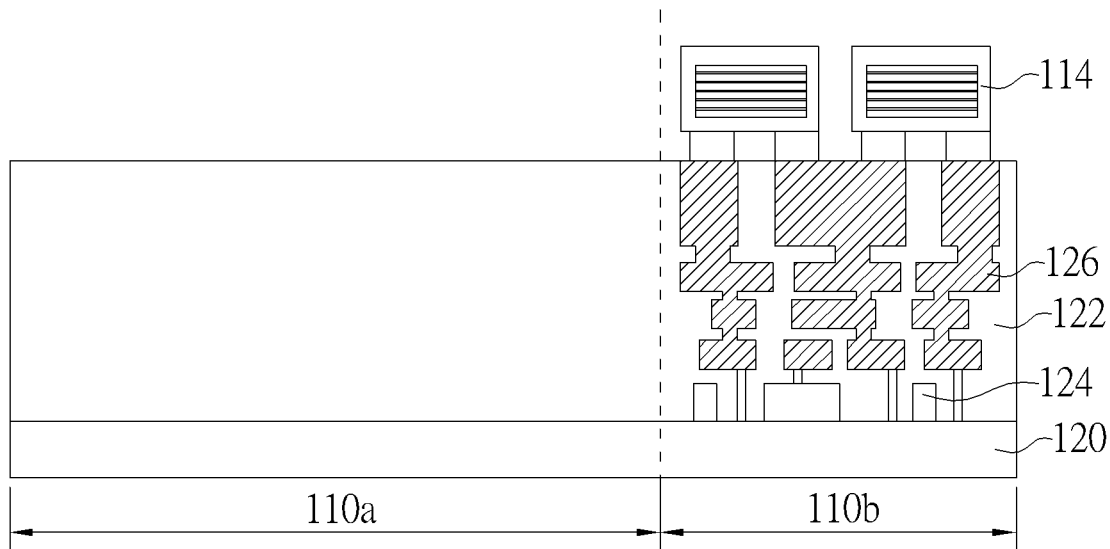

Please refer to FIG. 7. After the pixel driver circuits 124 and metal interconnects 126 are formed on the edge region 110b, Micro LEDs 114 are set on the first transparent layer 122 and electrically connected with the metal interconnects 126 therein. In the embodiment of present invention, the Micro LEDs 114 will be first manufactured on a LED substrate and then be separated individually from the LED source substrate to be picked and placed on the substrate 120 and connected with corresponding metal interconnects 126 in mass transfer process, for example, through the method of flip chip interconnection. In this way, pixel driver circuits 124 may control the emitting of Micro LEDs 114 through metal interconnects 126.

Figure 8:
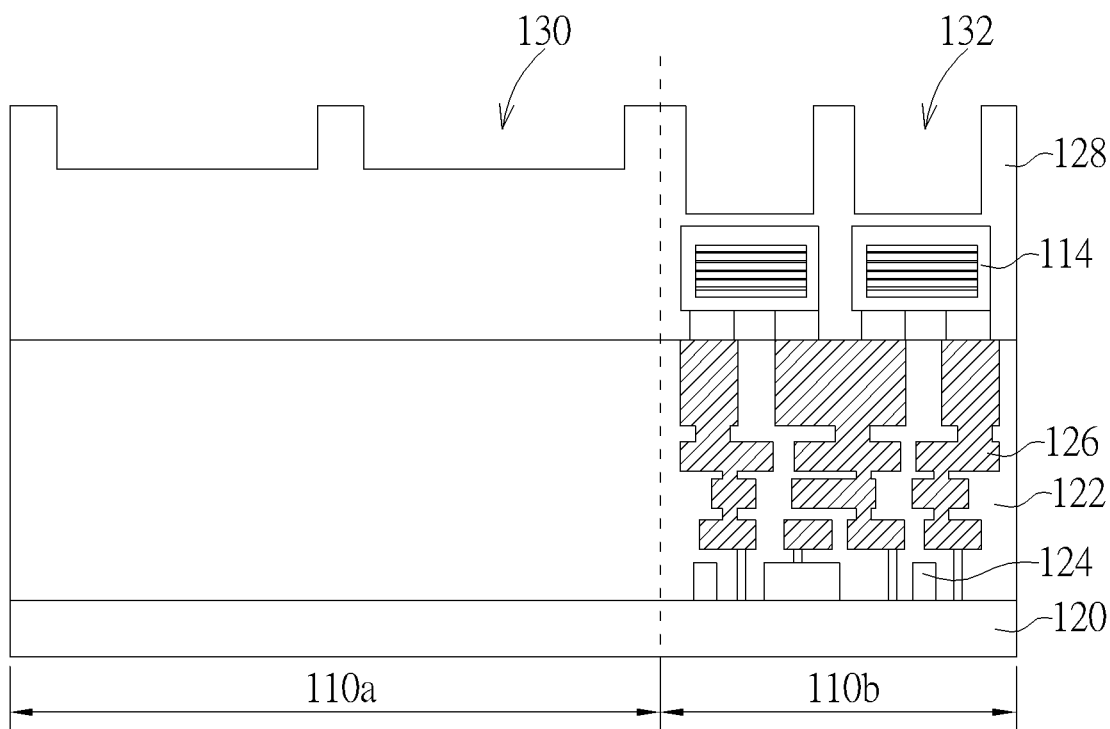

Please refer to FIG. 8. Micro lens array are manufactured after bonding the Micro LEDs. Firstly, form a second transparent layer 128 on the front surface of Micro LEDs 114 and first transparent layer 122. The material of second transparent layer 128 may be the same as the one of first transparent layer 122, ex. ultra low-k material or TEOS formed on the first transparent layer 122 through CVD process. The second transparent layer 128 would cover and protect Micro LEDs 114, and micro lens will be manufactured on the second transparent layer 128 in following process. Next, multiple recesses 130, 132 are formed on the second transparent layer 128 through photolithography. In the embodiment of present invention, recesses 130, 132 are generally arranged in an array on the surface of transparent layer, and since the dimensions of micro lens required on the Micro LEDs 114 and the transparent region 110a are different, the recesses 130, 132 formed on the transparent region 110a and the edge region 110b are also be different. In the preferred embodiment of present invention, each recess 132 on the edge region 110b would overlap and correspond to one of the bonded Micro LEDs 114.

Figure 9:
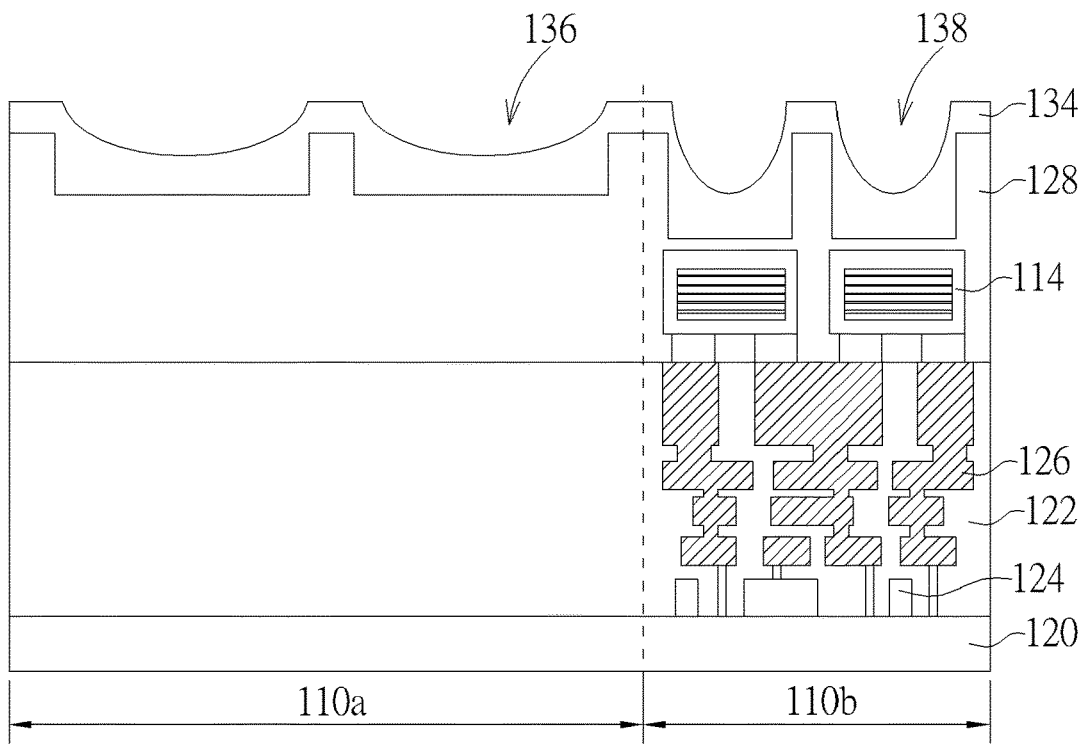

Please refer to FIG. 9. After the recesses 130, 132 are formed, a lens layer 134 is then formed on the second transparent layer 128. The material of lens layer 134 may be common optical plastic materials with a transmittance above 90%, such as polymethylmethacrylate (PMMA), polystyrene (PS), polycarbonate (PC), cycloolefin polymer (COP) and cyclic olefin copolymer (COC), covering entire surface of the second transparent layer 128 and filling up the recesses 130, 132. Next, perform a UV curing process to cure and shrink the deposited lens layer 134, so as to form the micro lenses 136, 138 as shown in the figure. In the embodiment of present invention, since the lens layer 134 for forming the micro lenses 136, 138 are deposited in the recesses 130, 132 with different widths and depths, the micro lenses 136, 138 formed after shrinking would have different curvatures to provide better visual balance. In the preferred embodiment of present invention, each micro lens 138 on the edge region 110b corresponds to a Micro LED 114 (sub-pixel) below. In other embodiment, it may be one micro lens 138 corresponding to several Micro LEDs 114, and the micro lens 138 may be convex lens instead of concave lens, depending on the inventive requirement.

Figure 10:
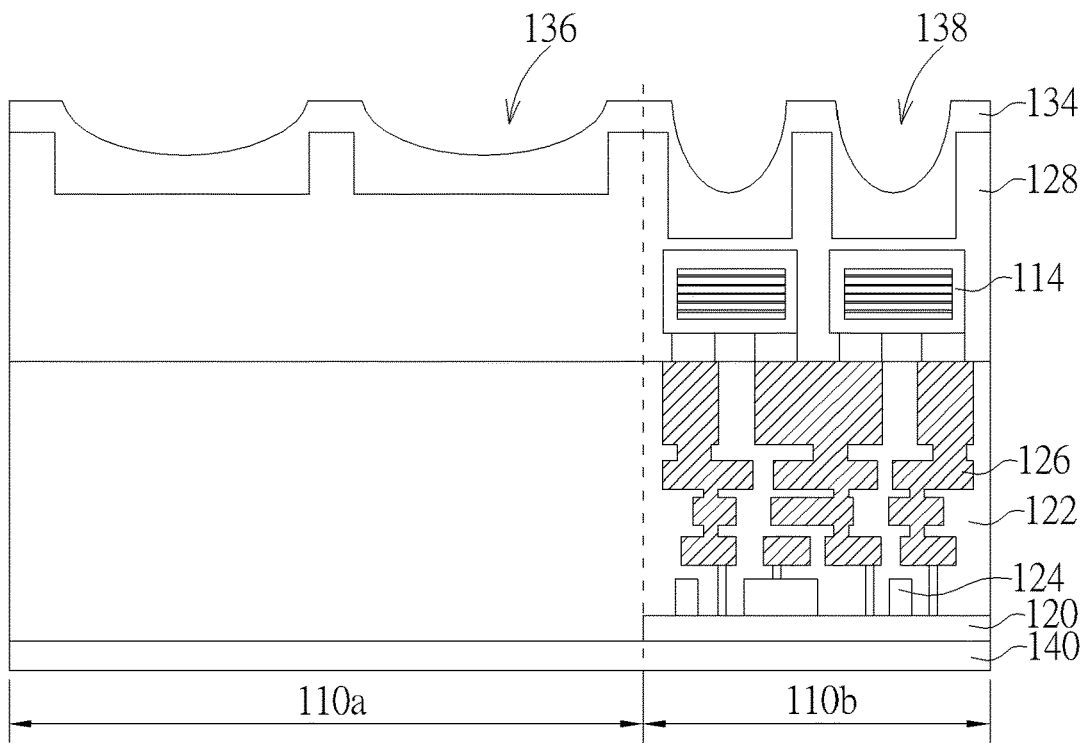

Please refer to FIG. 10. After the micro lens array is completed, a backside grinding process, ex. a chemical mechanical planarization (CMP) process, is then performed to thin the opaque substrate 120 in order to reduce its thickness and weight and make it suitable for final lens product. Next, a photolithography process is performed to remove the substrate 120 in the transparent region 110a in order to make the transparent region 110a transparent from front side to back side. Lastly, a protection layer 140 is coated on the substrate 120 and the exposed first transparent layer 122. The manufacture of Micro LED layout structure of the present invention is therefore completed. The aforementioned Micro LED layout structure may be used directly as a lens of smart glasses, or it may be used by adhering on an additional transparent substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a layout structure of Micro LED for augmented reality and mixed reality, comprising:
   providing a substrate, wherein multiple display units are arranged on said substrate to form an unit array, and each said display unit comprises an edge region and a transparent region surrounded by said edge region;
   forming pixel driver circuits and a first transparent layer on said edge region of every said display unit on said substrate;
   setting multiple Micro LEDs on said first transparent layer of said edge regions, wherein said Micro LEDs connect with said pixel driver circuits below;
   forming a second transparent layer on said Micro LEDs and on a front surface of said first transparent layer;
   thinning said substrate;
   removing said substrate on said transparent region to expose said first transparent layer, and said substrate on said edge region is remained; and
   forming a protection layer on back sides of said substrate and said exposed first transparent layer;
   wherein said first transparent layer, said second transparent layer, said Micro LEDs and said protection layer constitute a lens, and said lens is provided with a peripheral region and a middle region surrounded by said peripheral region, and said Micro LEDs and said pixel driver circuits are inside said lens, and said unit array is set on said middle region.

2. The method of manufacturing a layout structure of Micro LED for augmented reality and mixed reality of claim 1, further comprising:
   forming multiple recesses in said second transparent layer, wherein each said Micro LEDs overlaps one said recess;
   forming a lens layer on said second transparent layer, wherein said lens layer fills up said recesses; and
   performing a curing process to said lens layer to form micro lens on said lens layer.

3. The method of manufacturing a layout structure of Micro LED for augmented reality and mixed reality of claim 2, wherein said recesses on said transparent region and said recesses on said edge region have different widths and depths.

4. The method of manufacturing a layout structure of Micro LED for augmented reality and mixed reality of claim 1, further comprising manufacturing LED driver circuits and logic circuits that connect with said pixel driver circuit on said peripheral region.

5. The method of manufacturing a layout structure of Micro LED for augmented reality and mixed reality of claim 4, wherein said LED driver circuits, said logic circuits and said pixel driver circuits are formed in the same CMOS processes.

* * * * *